(12) United States Patent
Donkers et al.

(10) Patent No.: US 7,566,919 B2
(45) Date of Patent: Jul. 28, 2009

(54) METHOD TO REDUCE SEEDLAYER TOPOGRAPHY IN BICMOS PROCESS

(75) Inventors: Johannes Josephus Theodorus Marinus Donkers, Valkenswaard (NL); Petrus Hubertus Cornelis Magnee, Leuven (BE); Eddy Kunnen, Kessel-Lo (BE); Francois Igor Neuilly, Helecine (BE)

(73) Assignee: NXP B.V., Eindhoven (NL)

( * ) Notice: Subject to any disclaimer, the term of this patent is extended or adjusted under 35 U.S.C. 154(b) by 600 days.

(21) Appl. No.: 10/581,639

(22) PCT Filed: Dec. 9, 2004

(86) PCT No.: PCT/IB2004/052742

§ 371 (c)(1),
(2), (4) Date: Jun. 5, 2006

(87) PCT Pub. No.: WO2005/059989

PCT Pub. Date: Jun. 30, 2005

(65) Prior Publication Data

US 2007/0111485 A1    May 17, 2007

Related U.S. Application Data

(60) Provisional application No. 60/529,028, filed on Dec. 12, 2003.

(51) Int. Cl.
*H01L 21/20*    (2006.01)

(52) U.S. Cl. .................. 257/197; 257/565; 257/198; 257/183; 257/E29.188; 438/312; 438/761; 438/341; 438/368

(58) Field of Classification Search ............. 257/197, 257/198, 565, E21.371, E21.379, E29.193, 257/183, E29.188, E29.189, E29.19, E29.191
See application file for complete search history.

(56) References Cited

U.S. PATENT DOCUMENTS 5,789,286 A    8/1998    Subbanna
6,384,469 B1 *  5/2002    Chantre ................... 257/565

OTHER PUBLICATIONS

Forsberg, M., et al., "Shallow and Deep Trench Isolation for Use in RF-Bipolar IC:s", (date of publication unknown), 4 pages.

* cited by examiner

*Primary Examiner*—Minh-Loan T Tran
*Assistant Examiner*—Selim Ahmed
(74) *Attorney, Agent, or Firm*—Peter Zawilski

(57) ABSTRACT

A method for forming an epitaxial base layer in a bipolar device. The method comprises the steps of: providing a structure having a field isolation oxide region (12) adjacent to an active silicon region (10); forming a silicon nitride/silicon stack (14, 16) above the field isolation oxide region (12), wherein the silicon nitride/silicon stack (14, 16) includes a top layer of silicon (14) and a bottom layer of silicon nitride (16); performing an etch to the silicon nitride/silicon stack (14, 16) to form a stepped seed layer, wherein the top layer of silicon is etched laterally at the same time the bottom layer of silicon nitride is etched; and growing an Si/SiGe/Si stack (20) over the stepped seed layer and active region (10).

20 Claims, 2 Drawing Sheets

US 7,566,919 B2

METHOD TO REDUCE SEEDLAYER TOPOGRAPHY IN BICMOS PROCESS

CROSS REFERENCE TO RELATED APPLICATION

This application claims the benefit of U.S. provisional application Ser. No. 60/529,028 filed Dec. 12, 2003, which is incorporated herein by reference.

The present invention relates generally to the fabrication of a BICMOS device, and more specifically relates to a method for reducing the seedlayer topography in a BICMOS fabrication process.

The addition of germanium to silicon technologies to form silicon germanium (SiGe/SiGeC) devices has created a revolution in the semiconductor industry. Germanium is added to silicon to form high-performance heterojunction bipolar transistors (HBTs), which can operate at much higher speeds than standard silicon bipolar transistors. SiGe HBTs can operate at speeds previously attainable only with gallium-arsenide and enjoy the advantage of being manufactured in existing silicon fabs using standard tool sets. SiGe devices can also be integrated into standard CMOS logic technologies, resulting in the integration of high-performance analog and RF circuits with dense CMOS logic.

The performance and integration capability of SiGe devices has enabled the production of a wide range of new products for wireless and wired communications, high-speed-test, and disk-drive applications. SiGe products include chip sets for wireless cellular handsets and base stations, as well as wireless local area network and high-speed/high-capacity wired network applications.

One technique for growing epitaxial SiGeC base layers in bipolar devices is referred to as Differential Epitaxial Growth (DEG) or Non-Selective Epitaxial Growth (NSEG). One of the issues with DEG involves uniformnous nucleation. SiGe/SiGeC does not nucleate well on the field isolation oxide, i.e., on the shallow trench isolation (STI).

One way to address this problem is to use an amorphous or polysilicon seed layer on the field isolation oxide. For instance, a stack of silicon oxide, silicon nitride and amorphous silicon or polysilicon can be deposited on an STI patterned wafer.

In a BiCMOS process, the seed layer also serves as a protection layer for the CMOS (i.e., active) part of the wafer, during the bipolar processing steps. After the CMOS processing, the seed layer stack can be opened in the active area to expose the silicon substrate where the DEG process is performed and the bipolar transistor is processed. At the end of the bipolar processing, the seed layer can additionally be patterned to be used as a silicidation protect layer.

Depending on the design rules, the seed layer is either patterned inside or outside the active area. In the case where the seed layer is patterned outside the active area, the topography of the seed layer is added to the topography of the STI ditch. This additional topography on the STI ditch (e.g., 90 nm) has a negative influence on the subsequent processing. Accordingly, a need exists for a method that improves (i.e., reduces) the topography to avoid the negative processing effects.

The present invention addresses the above-mentioned problems, as well as others, by providing a stepped seed layer to smooth out the topography on the STI ditch. In a first aspect, the invention provides a method for forming an epitaxial base layer in a bipolar device, comprising: providing a structure having a field isolation oxide region adjacent to an active silicon region; forming a silicon nitride/silicon stack above the field isolation oxide region, wherein the silicon nitride/silicon stack includes a top layer of silicon and a bottom layer of silicon nitride; performing an etch to the silicon nitride/silicon stack to form a stepped seed layer, wherein the top layer of silicon is etched laterally at the same time the bottom layer of silicon nitride is etched; and growing an Si/SiGe/Si stack over the stepped seed layer and active region.

In a second aspect, the invention provides a structure for forming an epitaxial base layer in a bipolar device, comprising: a silicon nitride/silicon stack formed above a field isolation oxide region, wherein the silicon nitride/silicon stack includes a top layer of silicon and a bottom layer of silicon nitride, and wherein the top layer of silicon is laterally stepped back from the bottom layer of silicon nitride to form a stepped seed layer; and a smeared Si/SiGe/Si layer formed above both the stepped seed layer and an adjacent active silicon region.

In a third aspect, the invention provides a method for forming an epitaxial base layer in a bipolar device, comprising: providing a structure having a field isolation oxide region adjacent to an active silicon region; forming a silicon nitride/silicon stack above the field isolation oxide region, wherein the silicon nitride/silicon stack includes a top layer of silicon and a bottom layer of silicon nitride; substantially covering the field isolation oxide region with a photo-resist mask; and performing an etch to the silicon nitride/silicon stack to form a stepped seed layer, wherein the top layer of silicon is etched laterally at the same time the bottom layer of silicon nitride is etched vertically.

These and other features of this invention will be more readily understood from the following detailed description of the various aspects of the invention taken in conjunction with the accompanying drawings in which.

Figure 4:
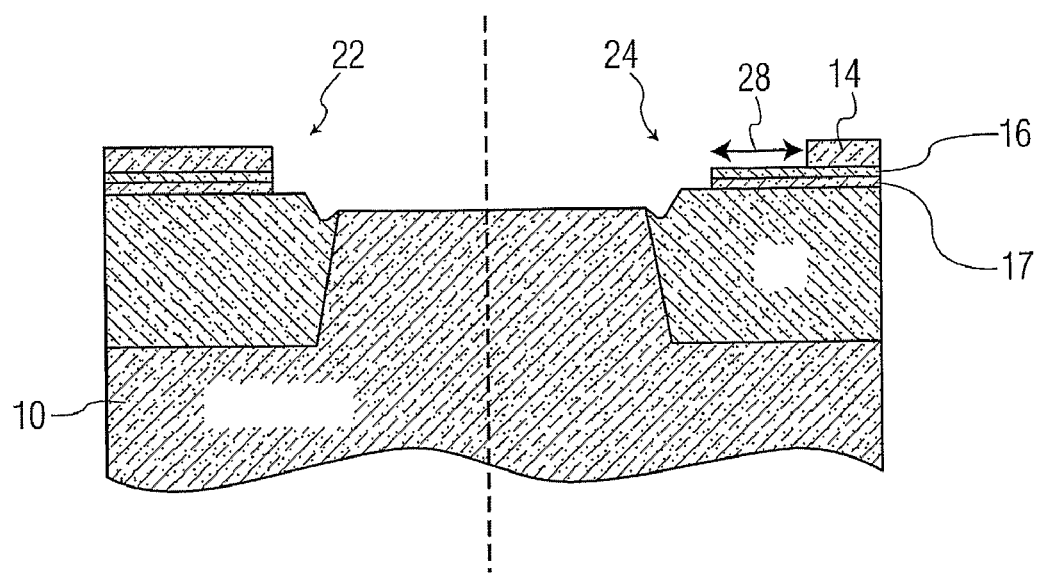

FIG. 4 contrasts cross-sections of a seed layer structure formed using a prior art technique and the current technique.

Figure 5:
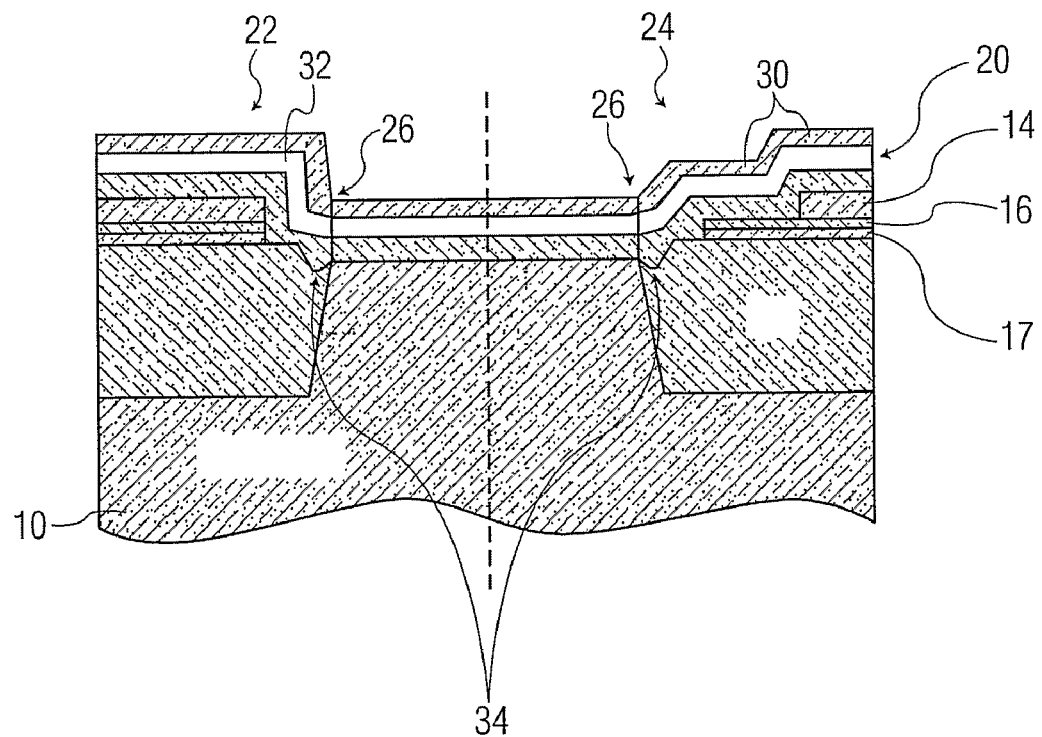

FIG. 5 depicts the cross-sections of FIG. 4 after a DEG process.

Figure 1:
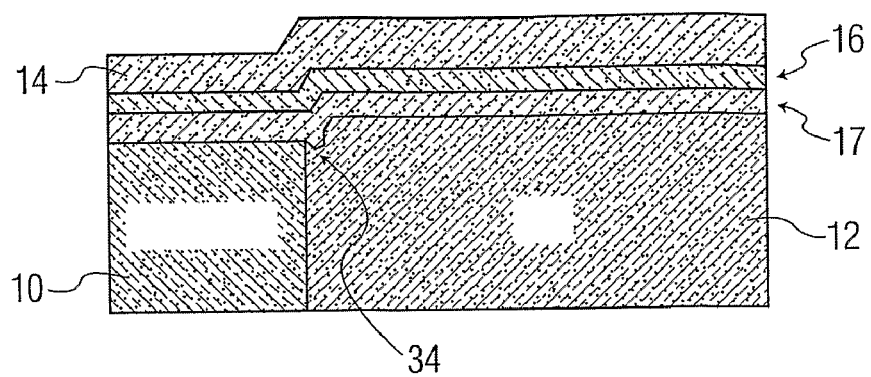
FIG. 1 depicts a structure having seed layers deposited on an STI.
Figure 2:
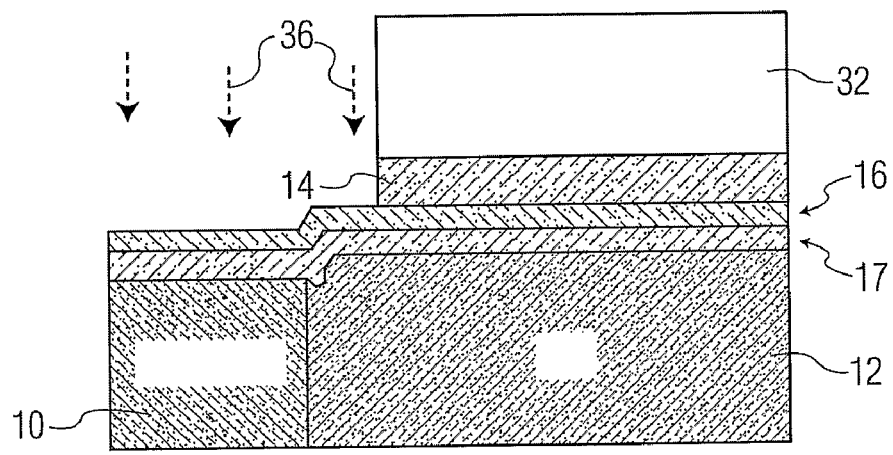
FIG. 2 depicts the structure of FIG. 1 being etched.
Figure 3:
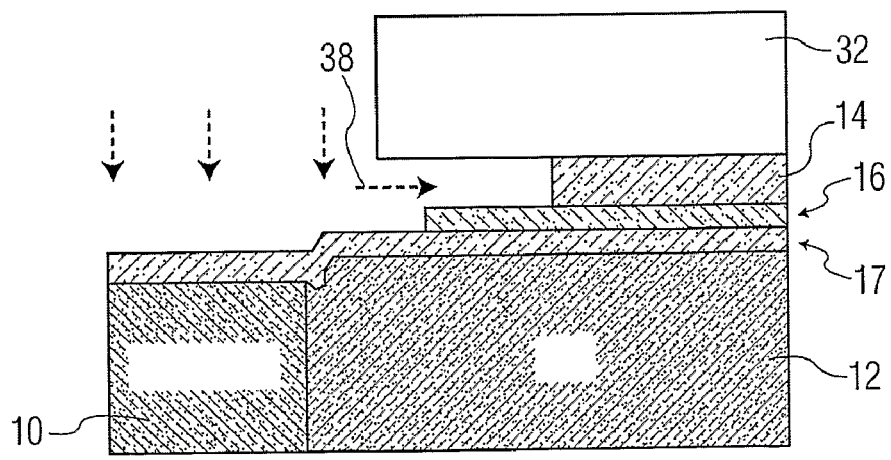
FIG. 3 depicts the resultant structure after etching.

Referring now to the drawings, FIGS. 1-3 depict the steps involved in an exemplary method for reducing the seedlayer topography in a BICMOS fabrication process. As depicted in FIG. 1, a portion of an STI patterned wafer is shown comprising an active silicon region 10 and a field isolation oxide region or STI region 12. Also shown is the STI ditch 34, which is formed where the active silicon region touches the oxide during the process of making the STI regions. More specifically, the STI ditch 34 is formed when hydrofluoric acid (HF) is used. Because HF etching is applied several times in various processes before the epitaxial growth, the STI ditch 34 is one of the features that introduce topography.

In the first step, a seedlayer comprised of silicon nitride 16 and silicon 14 (or polysilicon) is placed onto a silicon oxide layer 17. As is known in the art, the silicon oxide layer 17 is required since the silicon nitride or the silicon/silicon nitride stack 14, 16 has to be patterned, and the dry etch to do this is not allowed on the active silicon because it would damage the silicon lattice. The silicon oxide layer 17 can be grown or deposited. If deposited, layer 17 is present everywhere, and if grown, layer 17 is only present on the active silicon 10 where it is grown. In the latter case, all silicon that is exposed will oxidize during a thermal treatment. In FIG. 1, this would mean that only the top surface of the active Si area 10 would be covered with a thin silicon oxide layer. The silicon nitride layer 16 is deposited and the silicon layer 14 can be amorphous or polycrystalline.

Typical thicknesses for these layers are 50 nm for the silicon layer 14, 20 nm for the silicon nitride layer 16, and 20 nm for the silicon oxide layer 17. The thickness of the seed layer 14, 16 increases the topography (i.e., the step) after patterning, which makes it difficult for dry etches later on in the process, to make precise patterning. To address this, an etch technique in accordance with the present invention is described below.

As shown in FIGS. 2-3, a "smearing" process is carried out to achieve the desired result. Specifically, an etch chemistry is utilized that laterally etches the top polysilicon layer 14 fast at the same time the bottom silicon nitride layer 16 is etched. In an exemplary embodiment, this can be achieved with an $SF_6$ based dry etch in a TCP9400 LAM RESEARCH™ reactor. The recipe is composed of 2 sub-steps: The first sub-step is an anisotropic polysilicon etch, meaning that the polysilicon is etched vertically down (as shown by arrows 36 in FIG. 2) with respect to, e.g., photo-resist mask 32, and the second sub-step is an anisotropic nitride etch with an isotropic polysilicon etch (as shown by arrow 38 in FIG. 3).

In general, plasma etching involves a model in which positive ions are accelerated by a bias voltage to the substrate and by sputter materials (i.e., referred to as ion sputtering). Chemical etching occurs when neutral reactive species (called radicals) react with the surface to make a chemical a volatile component. For the polysilicon etch, $Cl_2$/HBr chemistry may be used. The etching mechanisms are ion sputtering driven, so the etch is anisotropic.

When the silicon layer 14 is etched, the chemistry is changed to a $SF_6$ plasma. The nitride etch is ion-sputtering driven, but free fluorine radicals are present in the plasma and fluorine atoms are highly reactive with pure silicon (accordingly, the chemical etching is very important). Thus, while the nitride is etched with ions, the polysilicon is laterally etched (there is still some photoresist on top) with radicals. With this technique, the topography is reduced because the polysilicon 14 is "pushed" away.

This method could work with other fluorine gases, although care must be taken while using fluorocarbon gases ($CHF_3$, $CH_2F_2$, $C_4F_8$, $C_3F_6$, and $NF_3$ for example), because fluorine atoms react chemically, but carbon atoms consume fluorine by forming polymers so that it prevents chemical etching by creating a protective layer on the sidewall, so only ion sputtering etch is possible. Thus, care must be used in selecting an appropriate fluor-to-carbon (F/C) ratio.

The lateral etching of the silicon layer 14 is self-aligned to the nitride etch of the silicon nitride layer 16. This self-alignment provides an extra benefit, because if two litho operations (resist spin, exposure, development) were required, the two lithography steps could be easily misaligned. In such a case, the exposed nitride surface could then be larger at the left than at the right (in cross-section). Typical best in class alignment specs are on the order of ~30-50 nm.

As can be seen in FIG. 3, a "stepped" structure is formed in which the silicon layer 14 is laterally etched far from the active silicon region 10, and the silicon nitride layer 16 is etched between the active silicon region 10 and the silicon layer 14. The result is a topography having two small steps or tiers instead of one big one. The fact that part of the silicon nitride layer 16 is left uncovered in this manner has no significant consequences on the differential epitaxial growth (DEG) process. The distance from the edge of the silicon layer 14 to the edge of the silicon nitride is typically 100 nm or more. The distance of the nitride layer 16 to the silicon seed edge is typically of that same distance (e.g., a few hundred nm).

FIG. 4-5 depicts a cross-section of the structure (before and after the DEG process takes place) in which the left side depicts the prior art technique 22 and the right side depicts the current technique 24 in accordance with the present invention. (Note that these figure are used solely to contrast the current technique 24 versus the prior art technique 22, and are not meant to suggest that both techniques should be used to form a single device.) As can be seen in FIG. 4, the silicon layer 14 on the right side, using the current technique 24, has been etched laterally as indicated by arrow 28 to create a stepped seed layer.

FIG. 5 depicts the structure after the DEG process has taken place and EPI stack 20 has been formed. Reference numeral 26 shows the point between where the grown Si/SiGe/Si stack 20 transitions from epitaxial (mono-crystalline) over the active region 10 to polycrystalline over the STI. As can be seen, using the prior art technique 22, the topography 32 of stack 20 comprises a severe slope. Conversely, the topography 30 of the EPI stack 20 using the current technique 24 has been smeared out to provide a much more gentle slope.

The foregoing description of the preferred embodiments of the invention has been presented for purposes of illustration and description. They are not intended to be exhaustive or to limit the invention to the precise form disclosed, and obviously many modifications and variations are possible in light of the above teachings. Such modifications and variations that are apparent to a person skilled in the art are intended to be included within the scope of this invention as defined by the accompanying claims.

The invention claimed is:

1. A method for forming an epitaxial base layer in a bipolar device, comprising:
    providing a structure having a field isolation oxide region (12) adjacent to an active silicon region (10),
    forming a silicon nitride/silicon stack (14,16) above the field isolation oxide region (12), wherein the silicon nitride/silicon stack includes a top layer of silicon (14) and a bottom layer of silicon nitride (16);
    performing an etch to the silicon nitride/silicon stack (14, 16) to form a stepped seed layer, wherein the top layer of silicon (14) is etched laterally at the same time the bottom layer of silicon nitride (16) is etched; and
    growing an Si/SiGe/Si stack (20) over the stepped seed layer and active silicon region.

2. The method of claim 1, wherein the lateral etching of the silicon layer (14) is self-aligned to the etch of the silicon nitride layer (16).

3. The method of claim 1, wherein the field isolation oxide region comprises a shallow trench isolation (STI) region.

4. The method of claim 1, comprising the further step of forming a silicon oxide layer (17) between the field isolation oxide region and the silicon nitride/silicon stack.

5. The method of claim 1, wherein the step of performing an etch to the silicon nitride/silicon stack comprises the steps of:
    performing an anisotropic polysilicon etch; and
    performing an anisotropic nitride etch with an isotropic polysilicon etch.

6. The method of claim 5, wherein a $Cl_2$/HBr chemistry is used for the anisotropic polysilicon etch.

7. The method of claim 5, wherein the silicon nitride layer is anisotropically etched in the presence of ions, and the silicon layer is laterally isotropically etched with radicals.

8. The method of claim 1, wherein the step of growing a Si/SiGe/Si stack is done with a differential epitaxial growth (DEG) process.

9. The method of claim 1, wherein the silicon layer is laterally etched at least 200 nm.

10. A structure for forming an epitaxial base layer in a bipolar device, comprising:
   a silicon nitride/silicon (14,16) above a field isolation oxide region (12), wherein the silicon nitride/silicon stack (14,16) includes a top layer of silicon (14) and a bottom layer of silicon nitride (16), and wherein the top layer of silicon is laterally stepped back from the bottom layer of silicon nitride to form a stepped seed layer; and
   a smeared Si/SiGe/Si layer (20) formed above both the stepped seed layer and an adjacent active silicon region (10).

11. The structure of claim 10, wherein the top layer of silicon is laterally stepped back at least 200 nanometers.

12. The structure of claim 10, wherein the field isolation oxide region comprises a shallow trench isolation (STI) region.

13. The structure of claim 10, further comprising a silicon oxide layer (17) between the field isolation oxide region and the silicon nitride/silicon stack.

14. A method for forming an epitaxial base layer in a bipolar device, comprising:
   providing a structure having a field isolation oxide region (12) adjacent to an active silicon region (10);
   forming a silicon nitride/silicon stack (14,16) above the field isolation oxide region (12), wherein the silicon nitride/silicon stack includes a top layer of silicon (14) and a bottom layer of silicon nitride (16);
   substantially covering the field isolation oxide region (12) with a mask (32); and
   performing an etch to the silicon nitride/silicon stack (14, 16) to form a stepped seed layer, wherein the top layer of silicon (14) is etched laterally at the same time the bottom layer of silicon nitride (16) is etched vertically.

15. The method of claim 14, comprising the further step of: growing an Si/SiGe/Si stack (20) over the stepped seed layer and active silicon region.

16. The method of claim 14, wherein the lateral etching of the silicon layer (14) is self-aligned to the etch of the silicon nitride layer (16).

17. The method of claim 14, wherein the field isolation oxide region comprises a shallow trench isolation (STI) region.

18. The method of claim 14, comprising the further step of forming a silicon oxide layer (17) between the field isolation oxide region and the silicon nitride/silicon stack.

19. The method of claim 14, wherein the silicon layer comprises polysilicon.

20. The method of claim 14, wherein the step of performing an etch to the silicon nitride/silicon stack comprises the steps of:
   performing an anisotropic polysilicon etch; and
   performing an anisotropic nitride etch with an isotropic polysilicon etch.

* * * * *